United States Patent
Lin et al.

(10) Patent No.: US 10,431,541 B2
(45) Date of Patent: Oct. 1, 2019

(54) SEMICONDUCTOR DEVICE, LAYOUT PATTERN AND METHOD FOR MANUFACTURING AN INTEGRATED CIRCUIT

(71) Applicant: Taiwan Semiconductor Manufacturing Co., Ltd., Hsinchu (TW)

(72) Inventors: Jian-Hong Lin, Huwei Township, Yunlin County (TW); Hsin-Chun Chang, Taipei (TW); Hui Lee, Hsinchu (TW); Yung-Sheng Huang, Hsinchu (TW); Yung-Huei Lee, New Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 59 days.

(21) Appl. No.: 15/463,105

(22) Filed: Mar. 20, 2017

(65) Prior Publication Data

US 2018/0269148 A1 Sep. 20, 2018

(51) Int. Cl.
*G06F 17/50* (2006.01)
*H01L 27/02* (2006.01)
(Continued)

(52) U.S. Cl.
CPC ...... *H01L 23/5226* (2013.01); *G06F 17/5077* (2013.01); *H01L 23/5283* (2013.01); *H01L 27/0207* (2013.01)

(58) Field of Classification Search
CPC .......... H01L 23/5226; H01L 23/5283; H01L 27/0207; H01L 21/28587–28593;
(Continued)

(56) References Cited

U.S. PATENT DOCUMENTS

2001/0015464 A1* 8/2001 Tamaki ............... G06F 17/5068
257/393
2008/0197502 A1* 8/2008 Kikuchi ............... H01L 21/2885
257/758

(Continued)

OTHER PUBLICATIONS

XU, F., et al.; "Designing a Practical Access Point Association Protocol;" IEEE Infocom; 2010; pp. 1-9.

*Primary Examiner* — Moazzam Hossain
*Assistant Examiner* — Stanetta Isaac
(74) *Attorney, Agent, or Firm* — McClure, Qualey & Rodack, LLP

(57) ABSTRACT

A semiconductor device for fabricating an IC is provided. The semiconductor device includes an interconnect structure and a first conductive line. The interconnect structure is made of conductive material and includes a first interconnect portion and a second interconnect portion. The second interconnect portion is connected to a first end of the first interconnect portion, and a width of the second interconnect portion is less than a width of the first interconnect portion. The first conductive line is arranged over or below the first interconnect portion and providing an electrical connection between the interconnect structure and an electrical structure. A distance between the first conductive line and the first end is less than a distance between the first conductive line and a second end of the first interconnect portion which is opposite to the first end.

20 Claims, 10 Drawing Sheets

(51) Int. Cl.
*H01L 23/522* (2006.01)
*H01L 23/528* (2006.01)

(58) Field of Classification Search
CPC . H01L 23/49838–49844; H01L 29/41–42396; H01L 2224/21–211; H01L 2224/29005–29036; H01L 2224/45005–45034; H01L 23/05; H01L 23/52; H01L 23/522; H01L 23/528; H01L 27/0203; G06F 17/5077; G06F 17/5068–5081
See application file for complete search history.

(56) References Cited

U.S. PATENT DOCUMENTS

| | | | | |
|---|---|---|---|---|
| 2013/0087881 | A1* | 4/2013 | Ikegami | H01L 27/0207 257/499 |
| 2013/0334610 | A1* | 12/2013 | Moroz | H01L 21/823821 257/369 |
| 2014/0162278 | A1* | 6/2014 | Richards | C12Q 1/6806 435/6.12 |
| 2014/0312507 | A1* | 10/2014 | Watanabe | H01L 23/522 257/774 |
| 2016/0240472 | A1* | 8/2016 | Lin | H01L 23/528 |

* cited by examiner

SEMICONDUCTOR DEVICE, LAYOUT PATTERN AND METHOD FOR MANUFACTURING AN INTEGRATED CIRCUIT

BACKGROUND

The semiconductor integrated circuit (IC) industry has experienced rapid growth. Continuing advances in semiconductor manufacturing processes have resulted in semiconductor device structures with finer features and/or higher degrees of integration. Functional density (i.e., the number of interconnected devices per chip area) has generally increased while feature size (i.e., the smallest component that can be created using a fabrication process) has decreased. The scaling-down process generally provides benefits by increasing production efficiency and lowering associated costs.

The recent trend in miniaturizing IC has resulted in smaller devices which consume less power yet provide more functionality at higher speeds. However, the miniaturization process has also resulted in stricter design and manufacturing specifications as well as reliability challenges. For one or more of these advantages to be realized, various developments in IC design and/or manufacture are considered. Stress Migration (SM) is a failure mechanism that occurs in integrated circuit metallization from the formation of voids between grain boundaries. As IC's are further reduced in size, new SM failure modes in interconnect structures are discovered affecting IC performance and/or reliability.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1A:
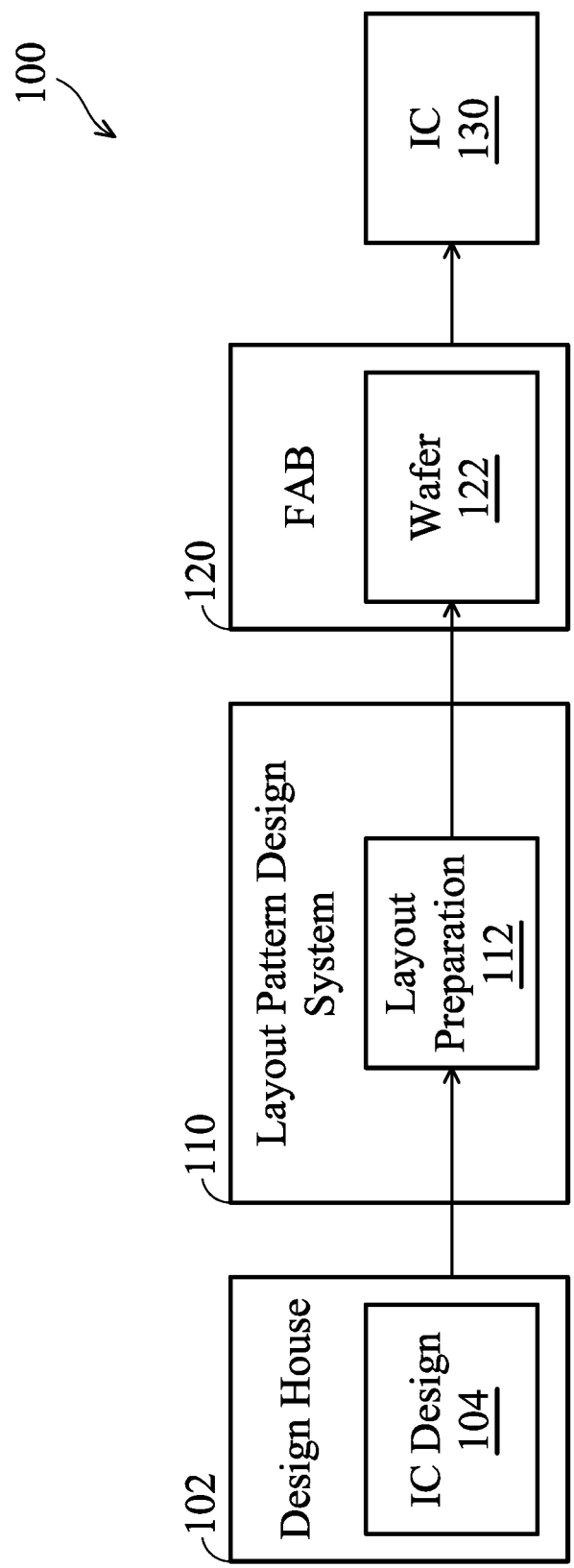
FIG. 1A is a simplified block diagram of an embodiment of an integrated circuit (IC) manufacturing system and an associated IC manufacturing flow.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

FIG. 1A is a simplified block diagram of an embodiment of an integrated circuit (IC) manufacturing system 100 and an associated IC manufacturing flow, which may benefit from various aspects of the present disclosure. The IC manufacturing system 100 includes a plurality of entities, such as a design house 102, an layout pattern design system 110, and an IC manufacturer 120 (i.e., a fab), that interact with one another in the design, development, and manufacturing cycles and/or services related to manufacturing an integrated circuit (IC) 130. The IC 130 may include a plurality of semiconductor devices.

The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 102, layout pattern design system 110, and IC manufacturer 120 may be owned by a single larger company, and may even coexist in a common facility and use common resources.

The design house (or design team) 102 generates an IC design 104. In some embodiments, the IC design 104 includes processing data which are used in layout pattern, mask design and semiconductor processes for manufacturing the IC 130. The IC design 104 may further include various geometrical patterns designed for the IC 130. The geometrical patterns correspond to patterns of metal, oxide, or semiconductor layers that make up the various components of the IC 130 to be fabricated. The various layers combine to form various IC features.

For example, a portion of the IC design 104 includes various IC features, such as active regions, gate electrodes, sources and drains, metal lines or vias of an interlayer interconnection, and openings for bonding pads, to be formed in a semiconductor substrate (such as a silicon wafer) and various material layers disposed on the semiconductor substrate. The design house 102 implements a proper design procedure to form the IC design 104. The design procedure may include logic design, physical design, and/or place and route.

The layout pattern design system 110 includes a layout preparation 112, and the layout preparation 112 receives the IC design 104 from the design house 102 to generate layout pattern for manufacturing the semiconductor devices on the wafer 122. Therefore, the semiconductor process is performed on the wafer 122 in the FAB 120 according to the layout patterns which were determined by the layout pattern design system 110.

The IC manufacturer 120, such as a semiconductor foundry, uses the processing parameters generated by the layout pattern design system 110 to fabricate the IC 130. The IC manufacturer 120 is an IC fabrication business that can include a myriad of manufacturing facilities for the fabrication of a variety of different IC products. For example, there may be a first manufacturing facility for the front end fabrication of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business.

In the present embodiment, a wafer 122 is fabricated using one or more masks to form the IC 130. The semiconductor wafer includes a silicon substrate or another proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The wafer 122 may further include various doped regions, dielectric features, and multilevel interis connected to (formed at subsequent manufacturing steps).

Figure 1B:
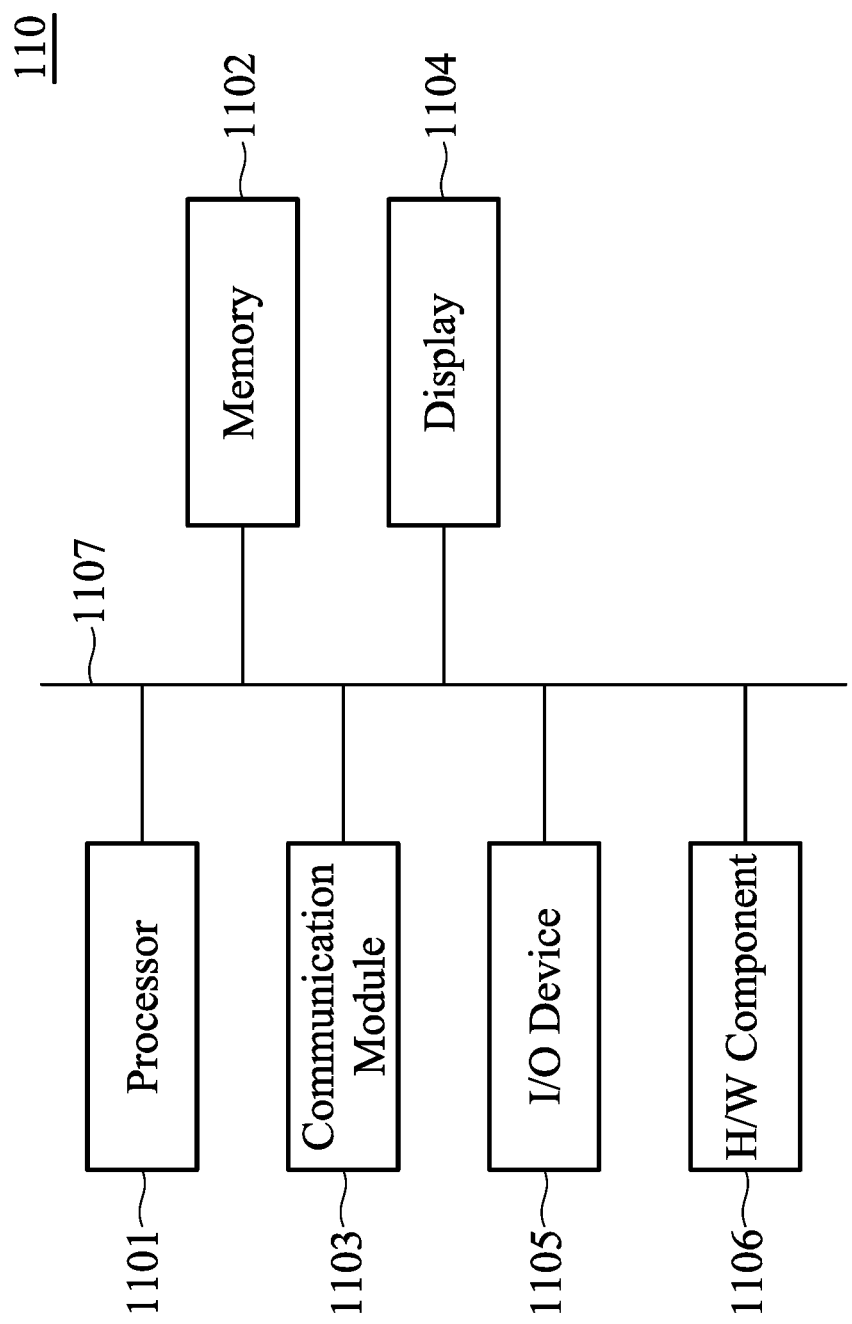
FIG. 1B is a more detailed block diagram of the layout pattern design system shown in FIG. 1A according to various aspects of the present disclosure.

FIG. 1B is a more detailed block diagram of the layout pattern design system 110 shown in FIG. 1A according to various aspects of the present disclosure. One or more of the tools and systems and operations described with respect to FIGS. 2-5 is realized in some embodiments by the layout pattern design system 110 of FIG. 1B. The etching system 100 includes a processor 1101, a memory 1102, a communication module 1103, a display 1104, an input/output (I/O) device 1105, and one or more hardware components 1106 communicatively coupled via a bus 1107 or another interconnection communication mechanism.

The processor 1101 could include a digital signal processor (DSP), a microcontroller (MCU), a central-processing unit (CPU) or a plurality of parallel processors relating the parallel processing environment to implement the operating system (OS), firmware, driver and/or other applications of the layout pattern design system 110.

The memory 1102 comprises, in some embodiments, a random access memory (RAM) or another dynamic storage device or read only memory (ROM) or other static storage devices, coupled to the bus 1107 for storing data and/or instructions to be executed by the processor 1101. The memory 1102 is also used, in some embodiments, for storing temporary variables or other intermediate information during the execution of instructions to be executed by the processor 1101.

The communication module 1103 is operable to communicate information such as IC design layout files with the other components in the IC manufacturing system 100, such as design house 102. Examples of communication modules may include Ethernet cards, 802.11 WiFi devices, cellular data radios, and/or other suitable devices known in the art.

The display 1104 is utilized to display the processing data and processing parameter the IC 130. The display 1104 can be a liquid-crystal panel or a touch display panel. The I/O device 1105 includes an input device, an output device and/or a combined input/output device for enabling user interaction with the layout pattern design system 110. An input device comprises, for example, a keyboard, keypad, mouse, trackball, trackpad, and/or cursor direction keys for communicating information and commands to the processor 1101. An output device comprises, for example, a display, a printer, a voice synthesizer, etc. for communicating information to the user.

Figure 2:
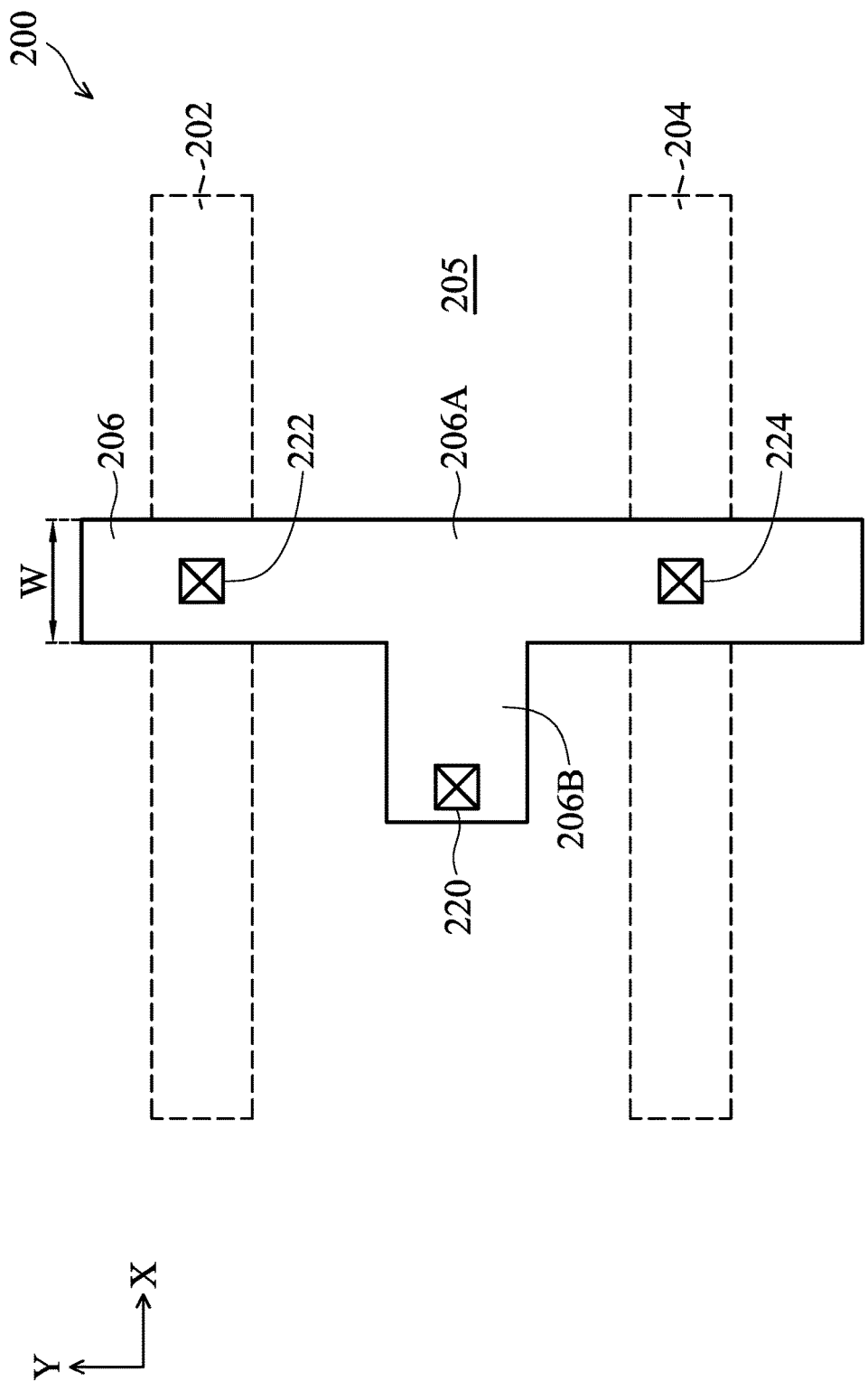
FIG. 2 is a layout diagram of a semiconductor device in accordance with some embodiments.

FIG. 2 is a layout diagram of a semiconductor device 200 in accordance with some embodiments. Semiconductor device 200 includes an electrical structure 202 connected to another electrical structure 204 by an interconnect structure 206. Interconnect structure 206 is connected to electrical structure 202 by conductive line 222. Interconnect structure 206 is connected to electrical structure 204 by conductive line 224. Semiconductor device 200 also includes an isolation region 205 which is located outside at least the area defined by electrical structure 202 and electrical structure 204.

The electrical structure 202 is at least a portion of a circuit element. In some embodiments, the electrical structure 202 includes one or more oxide diffusion (OD) regions. The OD region refers to an active area of a substrate. In some embodiments, the electrical structure 202 includes one or more poly-silicon structures. In some embodiments, the electrical structure 202 is a whole circuit element. In some embodiments, the electrical structure 202 is a lower or higher level of an interconnect structure. In some embodiments, the electrical structure 202 includes one or more active elements and/or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, and planar MOS transistors with raised source/drains. Examples of passive elements include, but are not limited to, capacitors, inductors, fuses, and resistors. The electrical structure 202 is configured to extend along a direction X. The electrical structure 202 is connected to interconnect structure 206 by conductive line 222.

The electrical structure 204 is at least a portion of a circuit element. In some embodiments, the electrical structure 204 includes one or more OD regions. In some embodiments, the electrical structure 204 includes one or more poly-silicon structures. In some embodiments, electrical structure 204 is a whole circuit element. In some embodiments, the electrical structure 204 includes a lower or higher layer of an interconnect structure. In some embodiments, the electrical structure 204 includes one or more active elements and/or passive elements. Electrical structure 204 is configured to extend along direction X. Electrical structure 204 is connected to interconnect structure 206 by conductive line 224.

The isolation region 205 is located outside at least the area defined by electrical structure 202 and electrical structure 204. Isolation region 205 surrounds at least electrical structure 202 or electrical structure 204. The interconnect structure 206 includes an interconnect portion 206A (first interconnect portion) and an interconnect portion 206B (second interconnect portion).

The interconnect structure 206 is configured to connect the electrical structure 202 and the electrical structure 204. The interconnect structure 206 is over the electrical structure 202 or the electrical structure 204. In some embodiments, the interconnect structure 206 overlaps the electrical structure 202 or the electrical structure 204. In some embodiments, the interconnect structure 206 is configured to extend in direction X and/or direction Y.

In some embodiments, interconnect structure 206 is arranged in a T-shape or an L-shape. In some embodiments, interconnect structure 206 is arranged in a comb-shape such that the interconnect structure 206 includes one or more side portions (e.g., interconnect portion 206B) connected to a central portion (e.g., interconnect portion 206A). In some embodiments, the one or more side portions (e.g., interconnect portion 206A) extend from the central portion (e.g., interconnect portion 206A) in direction X. In some embodiments, the one or more side portions (e.g., interconnect portion 206B) are arranged in a parallel configuration.

The interconnect structure 206 includes a conductive material. In some embodiments, the interconnect structure 206 includes a metal. In some embodiments, interconnect structure 206 includes copper, aluminum, nickel, titanium, tungsten, alloys thereof or another suitable conductive material. In some embodiments, interconnect structure 206 includes one or more conductive portions. In some embodiments, the interconnect structure 206 is configured as a data line to carry a data signal. In some embodiments, the interconnect structure 206 is configured as a power line to carry a power supply voltage or a ground reference voltage.

Interconnect portion 206A is configured to connect electrical structure 202 and electrical structure 204. Interconnect portion 206A is over electrical structure 202 or electrical structure 204. In some embodiments, interconnect portion 206A overlaps electrical structure 202 or electrical structure 204. Interconnect portion 206A is configured to extend in direction Y perpendicular to direction X. Interconnect portion 206A has a width W measurable along the direction X.

Interconnect portion 206B is directly connected to interconnect portion 206A. Interconnect portion 206B is located on the same interconnect layer as interconnect portion 206A. In some embodiments, the interconnect portion 206B and interconnect portion 206A are integrally formed. In some embodiments, the interconnect portion 206B and interconnect portion 206A are referred to as a nose structure. In some embodiments, the interconnect portion 206B is referred to as a branch line structure. In some embodiments, interconnect portion 206A and interconnect portion 206B are arranged in a T-shape or an L-shape. In some embodiments, interconnect portion 206A and interconnect portion 206B are arranged in a comb-shape such that two or more second interconnect portions 206B are connected to a side of interconnect portion 206A. In some embodiments, one or more second interconnect portions 206B are connected to a first side of interconnect portion 206A, and one or more second interconnect portions 206B are connected to a second side of interconnect portion 206A. In some embodiments, the first side is an opposite side of interconnect portion 206A from the second side. In some embodiments, one or more second interconnect portions 206B extend from the interconnect portion 206A in direction X or direction −X. In some embodiments, two or more second interconnect portions 206B are arranged in a parallel configuration.

In some embodiments, each of the conductive lines 220, 222 and 224 is a metal line, a via, a through silicon via (TSV), an inter-level via (ILV), a slot via, an array of vias, or another suitable conductive line. In some embodiments, each of the conductive lines 220, 222 and 224 includes copper, aluminum, nickel, titanium, tungsten, cobalt, carbon, alloys thereof or another suitable conductive material.

In some embodiments, each of the conductive lines 220, 222 and 224 includes one or more conductive line portions. In some embodiments, the conductive line 220 is over the interconnect structure 206. In some embodiments, the conductive line 220 is over or below the interconnect structure 206. Conductive line 222 is over or below the interconnect structure 206. Conductive line 224 is over or below the interconnect structure 206.

Figure 3A:
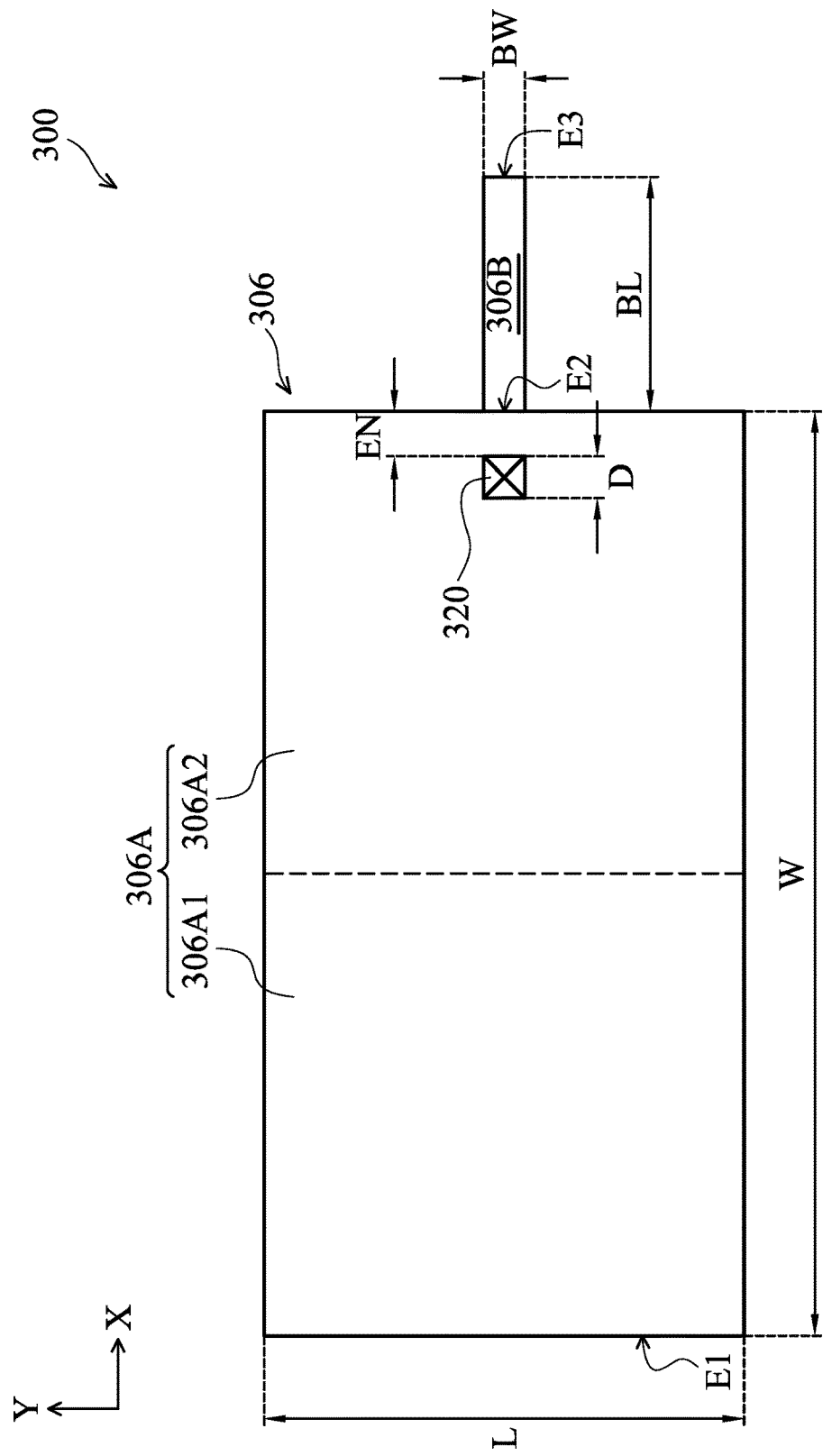
FIG. 3A is a layout diagram of a semiconductor device in accordance with some embodiments.

FIG. 3A is a layout diagram of a semiconductor device 300 in accordance with some embodiments. The semiconductor device 300 includes an interconnect structure 306 and a conductive line 320 (first conductive line), the conductive line 320 is for providing electrical connection between the interconnect structure 306 and an electrical structure (such as the electrical structure 202 or 204 as shown in FIG. 2). The interconnect structure 306 includes an interconnect portion 306A (first interconnect portion) and an interconnect portion 306B (second interconnect portion). The interconnect portion 306A could further include two interconnect portions 306A1 and 306A2, and the interconnect portion 306A2 is adjacent to the interconnect portion 306B.

As shown in FIG. 3A, The interconnect portion 306A has two ends E1 (second end) and E2 (first end) which are opposite to each other. The interconnect portion 306B has two ends E2 and E3 which are opposite to each other. In some embodiments, the interconnect portion 306B is connected to an end E2 of the interconnect portion 306A, and width BW of the interconnect portion 306B is less than width W of the interconnect portion 306A.

It should be noted that the interconnect structure 306 is an embodiment of the interconnect structure 206 shown in FIG. 2, and the conductive line 320 is an embodiment of any one of the conductive lines 220~224 shown in FIG. 2. Although not shown with the architecture of semiconductor device 300, the embodiments of FIG. 3 are sufficient to make each of the structures independently shown in semiconductor device 200 of FIG. 2 and the like. A person having ordinary skill in the art would appreciate that one or more of the layout patterns described herein is usable to prepare a set of masks, that are in turn usable for manufacturing a semiconductor device 300. The layout pattern of the semiconductor device 300 is a basis to be modified to form other layout structures, such as those described herein, e.g., FIGS. 3A-5C.

The interconnect portion 306A is configured to extend in direction Y, and it has a length L measurable along direction Y. The interconnect portion 306A has a width W measurable along the direction X. As shown in FIG. 3A, the interconnect portion 306A is formed in a shape a rectangle. In some embodiments, interconnect portion 306A could be arranged in an L-shape, a T-shape or a comb shape.

Furthermore, the interconnect portion 306A has a minimum design width Wmin measurable along the direction X. The minimum design width Wmin is the minimum width of the interconnect portion 306A capable of being reliably manufactured for a given technology node size and a consistent manufacturing yield.

In some embodiments, the minimum design width Wmin is defined by the FAB 120. In some embodiments, the minimum design width Wmin is defined by a design rule of the IC design 104. The minimum design width Wmin is defined based upon the technology node size. For example, as technology nodes sizes are reduced, the minimum design width Wmin is also reduced.

In some embodiments, the width W of the interconnect portion 306A is greater than minimum width Wmin. In some embodiments, the width W is at least greater than six times the minimum design width Wmin of the interconnect portion 306A as expressed by formula 1.

$$W \geq 6*Wmin \quad (1)$$

The interconnect portion 306B has a width BW measurable along direction Y. Interconnect portion 306B has a length BL measurable along direction X. In some embodiments, the length BL is measurable along direction X from an edge E2 of the interconnect portion 306A to an edge E3 of the interconnect portion 306B. The width BW of interconnect portion 306B is less than the length L of interconnect portion 306A.

In some embodiments, the width BW is in a range from one minimum design width of the interconnect portion 306A to two times the minimum design width of the interconnect portion 306A as expressed by formula 2.

$$2*Wmin \geq BW \geq Wmin \quad (2)$$

In some embodiments, the length BL of the interconnect portion 306B is less than half of the width W of the interconnect portion 306A as expressed by formula 3. Since the length of the interconnect portion 306A is limited, the area of the layout pattern of the semiconductor device 300 could be reduced.

$$W/2 \geq BL \quad (3)$$

In addition, the conductive line 320 has a via width D measurable along direction X. In some embodiments, the cross-section of the conductive line 320 is a square which length is equal to its width. In some embodiments, the via width D of the conductive line 320 is less than the width BW of interconnect portion 306B. In some embodiments, the via width D of the conductive line 320 is equal to the width BW of interconnect portion 306B.

In some embodiments, the conductive line 320 is arranged near the end E2 and the interconnect portion 306B. More specifically, as shown in FIG. 3A, the distance EN between the conductive line 320 and the end E2 is less than a distance between the conductive line 320 and the end E1. In other words, the distance EN between the conductive line 320 and the end E2 is less than half of the width W of the interconnect portion 306A as expressed by formula 4.

$$EN \leq W/2 \quad (4).$$

In some embodiments, the conductive line 320 is arranged below or over the interconnect region 306A2, rather than below or over the interconnect region 306A1. The distance between the interconnect regions 306A2 and 306B is less than the distance between the interconnect regions 306A1 and 306B. As a result, the location of the conductive line 320 is near the interconnect region 306B.

In some cases, the interconnect structure 306 has some vacancies, and the vacancies may migrate through the stress gradient. Specifically, the vacancies would accumulate at high stress gradient points and induce voiding. Some high-stress gradient points are located around the end E2. Voiding could be formed near the end E2 in the interconnect portion 306B due to its high stress gradient. The voiding may result in stress migration (SM) failure and deteriorate the semiconductor device 300. The conductive line 320 could be utilized to decrease and release the high-stress gradients. Therefore, the SM failure could be reduced.

Figure 3B:
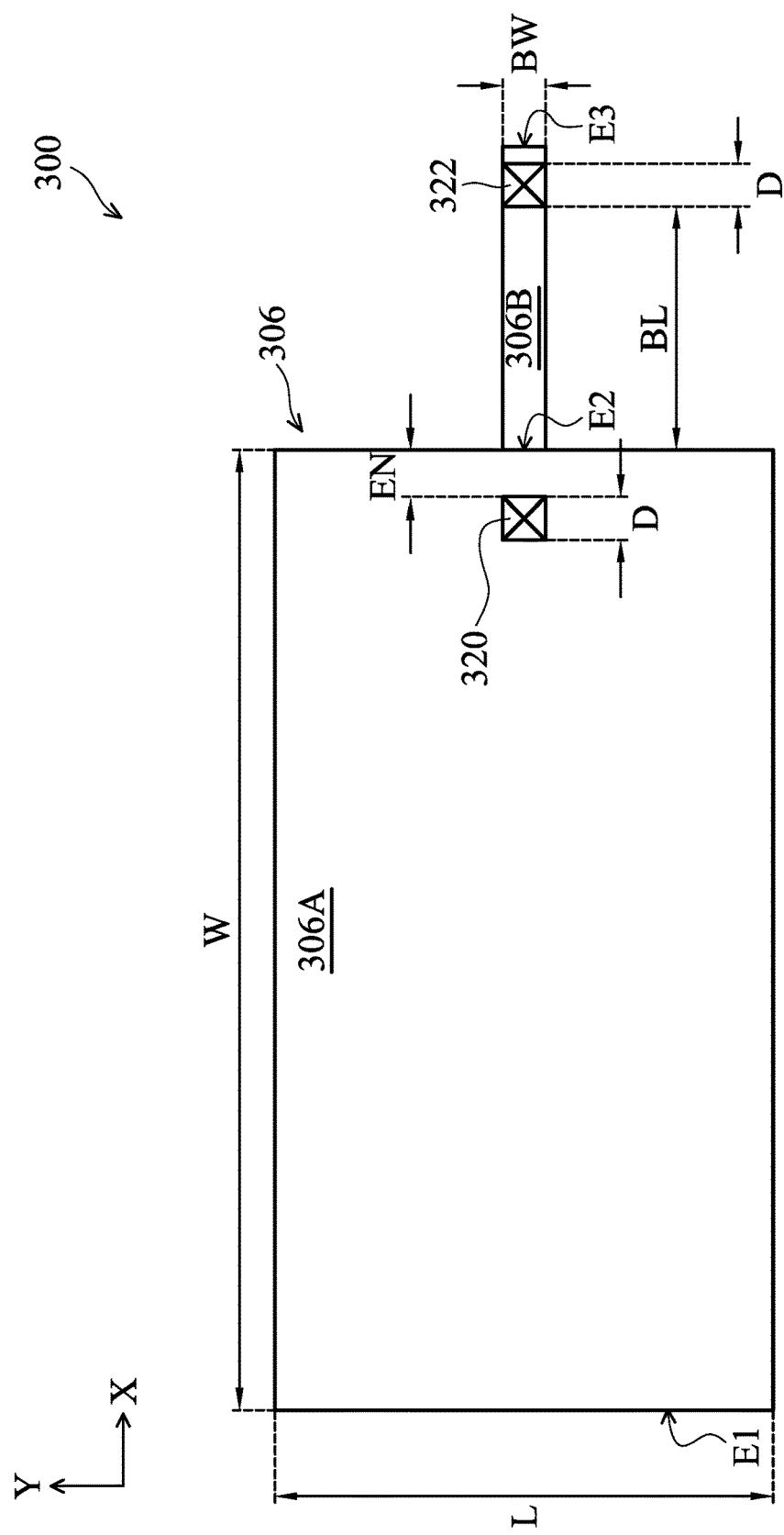
FIG. 3B is another layout diagram of a semiconductor device in accordance with some embodiments.

FIG. 3B is another layout diagram of a semiconductor device 300 in accordance with some embodiments. As shown in FIG. 3B, another conductive line 322 (second conductive line) is arranged below or over the interconnect portion 306B. Therefore, the voids of the interconnect structure 306 could be further reduced by the conductive line 322.

It should be noted that in the embodiments of the FIG. 3B, due to the arrangement of the conductive line 322, the length BL is measured from the end E2 to the conductive line 322. In some embodiments, the length BL of the interconnect portion 306B is less than half of the width W of the interconnect portion 306A as expressed by formula 3 for saving areas of the layout pattern.

Figure 4A:
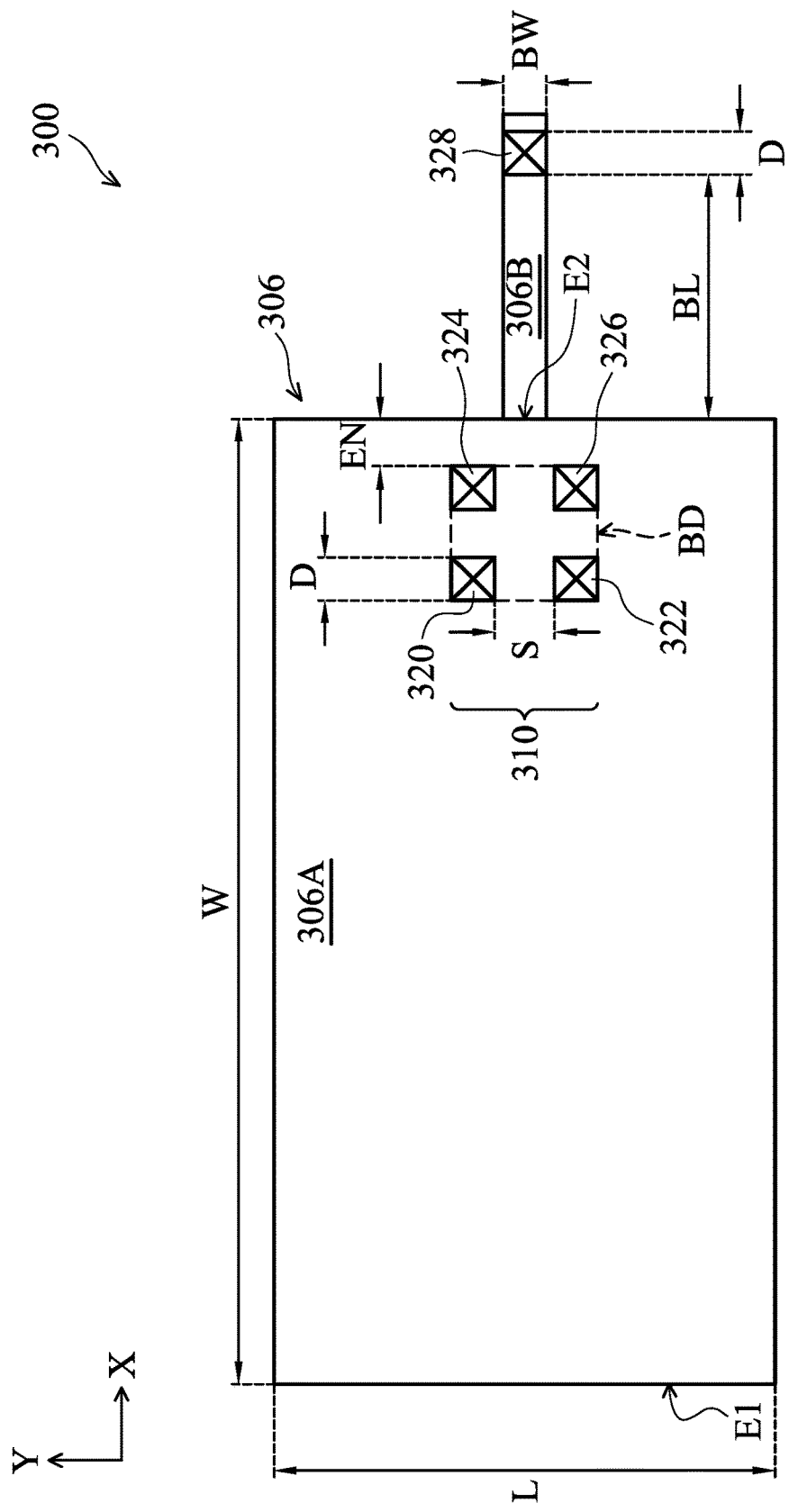
FIG. 4A is a layout diagram of a semiconductor device in accordance with some embodiments.

FIG. 4A is a layout diagram of a semiconductor device 300 in accordance with some embodiments. As shown in FIG. 4A, a conductive-line array 310 is arranged below or over the interconnect portion 306A. The conductive-line array 310 includes multiple conductive lines 320, 322, 324 and 326. Each of the conductive lines 320, 322, 324 and 326 has a via width D.

The four conductive lines 320, 322, 324 and 326 are surrounded by the boundary BD of the conductive-line array 310. The conductive line 328 is arranged below or over the interconnect portion 306B. Therefore, the voids of the interconnect structure 306 could be further reduced by the conductive line 328.

More specifically, a portion of the conductive lines 320~326 is over the interconnect portion 306A, and another portion of the conductive lines 320~326 is below the interconnect portion 306A. For example, conductive lines 320 and 322 are over the interconnect portion 306A, and another portion of the conductive lines 324 and 326 are below the interconnect portion 306A. In other embodiments, conductive line 320 is over the interconnect portion 306A, and another portion of the conductive lines 322, 324 and 326 are below the interconnect portion 306A.

In some embodiments, a conductive-line array 310 is arranged near the interconnect portion 306B to decrease and release the high-stress gradients. Therefore, the SM failure could be reduced because of the multiple conductive lines 320~326. In some embodiments, the distance between the conductive-line array 310 and the end E2 is less than the distance between the conductive-line array 310 and the end E1. In other words, the distance between the boundary BD and the end E1 is greater than the distance between the boundary BD and the end E2.

In some embodiments, the distance EN between at least one conductive line of the conductive-line array 310 and the end E2 is less than a distance between the conductive line and the end E1. As shown in FIG. 4A, the distance EN between the conductive line 324 (or 326) and the end E2 is less than a distance between the conductive line 324 and the end E1. In other words, the distance EN between the conductive line 324 and the end E2 is less than half of the width W of the interconnect portion 306A.

In the embodiments of FIG. 4A, the conductive-line array 310 is arranged in the shape of a square. The distance between any two of conductive lines 320~326 is S. In some embodiments, the distance S is in a range from one minimum design width of the interconnect portion 306A to ten times the minimum design width of the interconnect portion 306A as expressed by formula 5.

$$10*W\text{min} \geq S \geq W\text{min} \quad (5)$$

In some embodiments, the distance S is in a range from one minimum design width of the interconnect portion 306A to one-third of the width W of the interconnect portion 360A as expressed by formula 6.

$$W/3 \geq S \geq W\text{min} \quad (6)$$

Figure 4B:
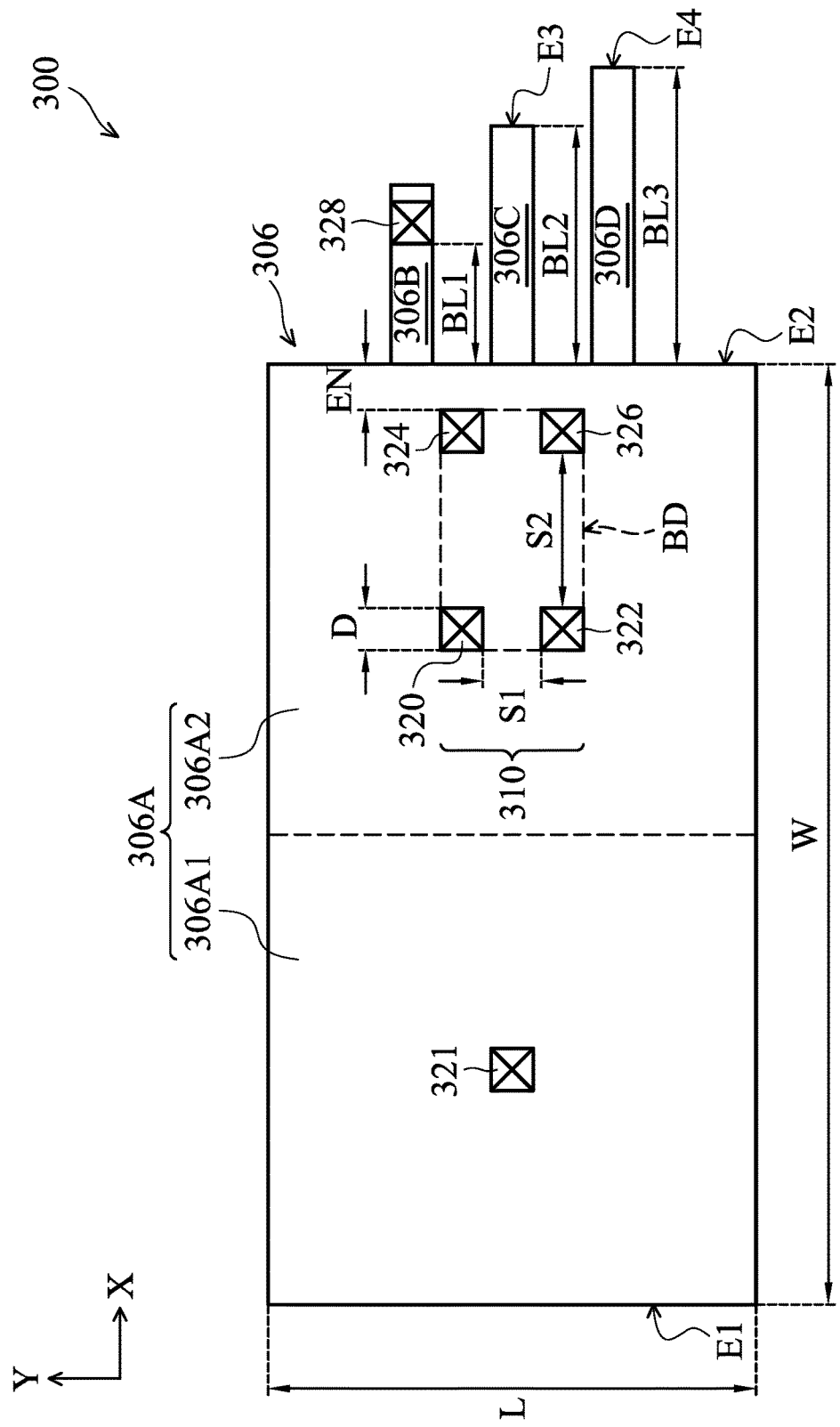
FIG. 4B is another layout diagram of a semiconductor device in accordance with some embodiments.

FIG. 4B is another layout diagram of a semiconductor device 300 in accordance with some embodiments. The interconnect structure 306 includes four interconnect portions 306A, 306B, 306C and 306D. The interconnect structure 306 also includes several conductive lines 320~328. The interconnect portion 306A could be divided into two interconnect portions 306A1 and 306A2. The three interconnect portions 306B-306D connect to the end E2 of the interconnect portion E2.

The length BL1 is measured from the end E2 to the conductive line 328. The length BL2 is measured from the end E2 to the end E3 of the interconnect portion 306C. The length BL3 is measured from the end E2 to the end E4 of the interconnect portion 306D. Each of the lengths BL1, BL2 and BL3 is less than half of the width W of the interconnect portion 306A. As a result, the area of the layout pattern of the semiconductor device 300 could be reduced.

In some embodiments, a conductive-line array 310 including four conductive lines 320~326 is arranged below or over the interconnect portion 306A. Each of the conductive lines 320, 322, 324 and 326 has a via width D. The four conductive lines 320, 322, 324 and 326 are surrounded by the boundary BD of the conductive-line array 310. The conductive line 328 is arranged below or over the interconnect portion 306B. Therefore, the voids of the interconnect structure 306 could be further reduced by the multiple conductive lines 320~328.

In some embodiments, a conductive-line array 310 is arranged below or over the interconnect portion 306A2 which is near the interconnect portion 306B to decrease and release the high-stress gradients. The conductive line 321 is arranged below or over the interconnect portion 306A1. Therefore, the SM failure could be reduced because of the multiple conductive lines 320~326.

In some embodiments, the distance between the conductive-line array 310 and the end E2 is less than the distance between the conductive-line array 310 and the end E1. In other words, the distance between the boundary BD and the end E1 is greater than the distance between the boundary BD and the end E2. The distance EN between the conductive line 324 and the end E2 is less than half of the width W of the interconnect portion 306A.

Furthermore, the conductive-line array 310 is formed in a shape of rectangle. As shown in FIG. 4B, the distance between the conductive lines 320 and 322 is S1, and the distance between the conductive lines 322 and 326 is S2. The distance S2 is greater than the distance S1. It should be noted that the shape of the rectangle or square of the conductive-line array 310 is for illustration, not for limiting the present disclosure. In other embodiments, the shape of the conductive-line array 310 is a triangle. The conductive-line array 310 could be formed in any arbitrary shape.

Each of the distances S1 and S2 is in a range from one minimum design width of the interconnect portion 306A to ten times the minimum design width of the interconnect portion 306A. In other embodiments, each of the distances S1 and S2 is in a range from one minimum design width of the interconnect portion 306A to one-third of the width W of the interconnect portion 360A.

Figure 5A:
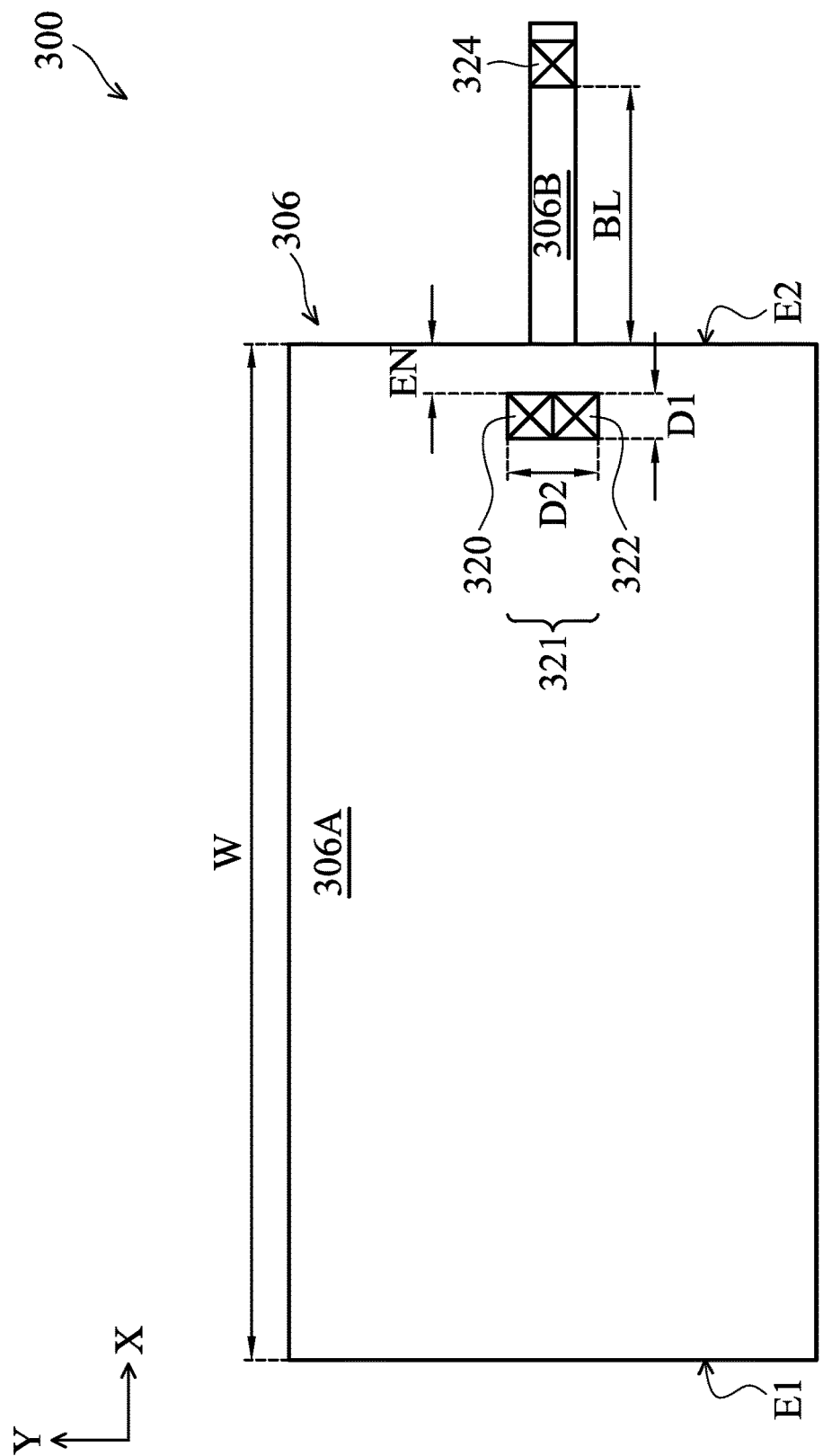
FIG. 5A is a layout diagram of a semiconductor device in accordance with some embodiments.

FIG. 5A is a layout diagram of a semiconductor device 300 in accordance with some embodiments. The conductive lines 320 and 322 with the via width D are formed along the direction Y in the interconnect portion 306A. The conductive line 324 is formed in the interconnect portion 306B.

In some embodiments, the two conductive lines 320 and 322 are directly adjacent to each other. Because the conductive line 320 directly is connected to the conductive line 322, the two conductive lines 320 and 322 could be regarded as a united conductive line 321. As shown in FIG. 5A, the united conductive line 321 has a via width D and a via length D2. The via length D2 is about two times the via width D. The area of united conductive line 321 is greater than the individual conductive line 320, 322 or 324. Therefore, the united conductive line 321 is effective for reducing the voids and preventing the SM failure.

Figure 5B:
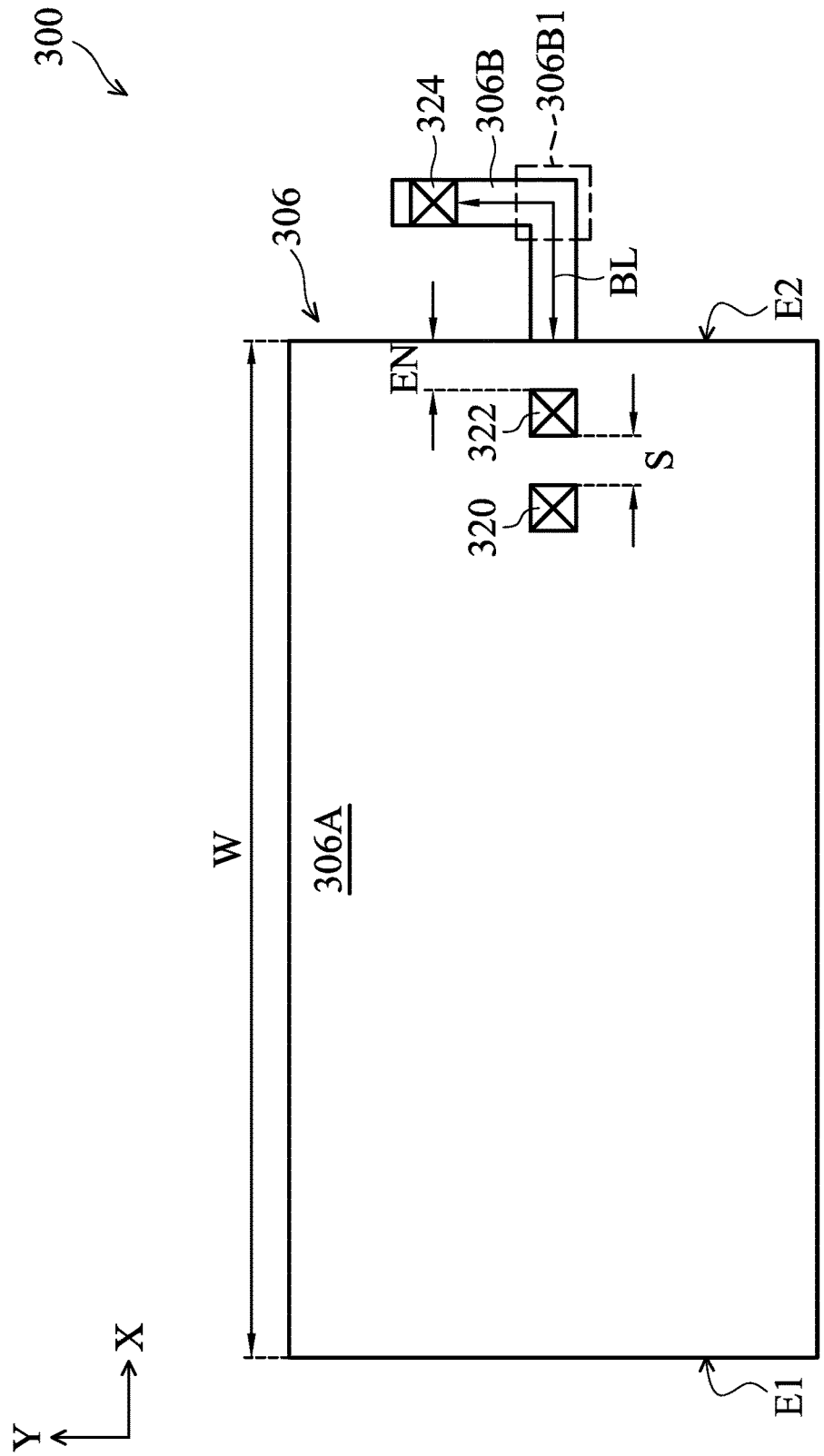
FIG. 5B is another layout diagram of a semiconductor device in accordance with some embodiments.

FIG. 5B is another layout diagram of a semiconductor device 300 in accordance with some embodiments. The conductive lines 320 and 322 are formed along the direction X in the interconnect portion 306A. The conductive line 324 is formed in the interconnect portion 306B. Since the corner 306B1 may have high-stress gradients, additional conductive line could be arranged below or over the corner 306B1 of the interconnect portion 306B.

In some embodiments, the interconnect portion 306B is arranged in the L-shape. The length BL is measured from the end E2 through the corner 306B1 to the conductive line 324. The length BL is less than half of the width W of the interconnect portion 306A. As a result, the area of the layout pattern of the semiconductor device 300 could be reduced.

Figure 5C:
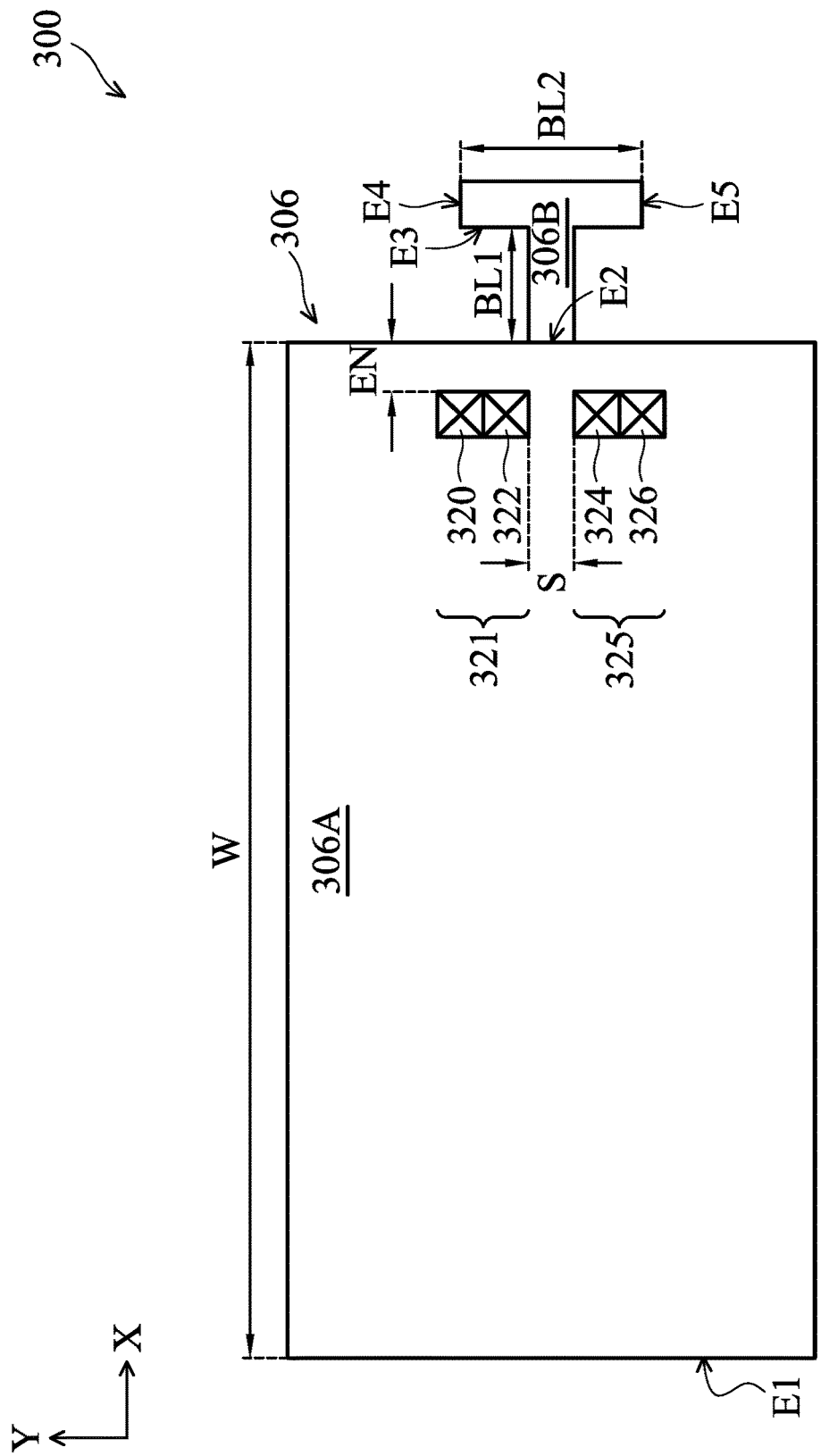
FIG. 5C is another layout diagram of a semiconductor device in accordance with some embodiments.

FIG. 5C is another layout diagram of a semiconductor device 300 in accordance with some embodiments. The united conductive lines 321 and 325 are formed along the direction Y in the interconnect portion 306A. The united conductive line 321 includes two conductive lines 320 and 322 which are directly adjacent to each other. The united conductive line 325 includes two conductive lines 324 and 326 which are directly adjacent to each other.

In some embodiments, the interconnect portion 306B is arranged in the T-shape. The length BL is determined by adding the two lengths BL1 and BL2. The length BL1 is measured from the end E2 of the interconnect portion 306A to the end E3 of the interconnect portion 306B. The length BL2 is measured from the end E4 to the end E5 of the interconnect portion 306B. The length BL is less than half of the width W of the interconnect portion 306A to decrease the area of the layout pattern of the semiconductor device 300.

In some embodiments, one or more of the operations and/or functions of the tools and/or systems described with respect to FIGS. 1A-5C is/are implemented by specially configured hardware (e.g., by one or more application-specific integrated circuits or ASIC(s)) which is/are included) separate from or in lieu of the processor 610. Some embodiments incorporate more than one of the described operations and/or functions in a single ASIC.

In some embodiments, the operations and/or functions are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In accordance with some embodiments, a semiconductor device for fabricating an IC is provided. The semiconductor device includes an interconnect structure and a first conductive line. The interconnect structure is made of conductive material and includes a first interconnect portion and a second interconnect portion. The second interconnect portion is connected to a first end of the first interconnect portion, and a width of the second interconnect portion is less than a width of the first interconnect portion. The first conductive line is arranged over or below the first interconnect portion and providing an electrical connection between the interconnect structure and an electrical structure. A distance between the first conductive line and the first end is less than a distance between the first conductive line and a second end of the first interconnect portion which is opposite to the first end.

In accordance with some embodiments, a semiconductor device for fabricating an IC is provided. The semiconductor device includes an interconnect structure and a conductive-line array. The interconnect structure is made of conductive material and includes a first interconnect portion and a second interconnect portion. The second interconnect portion is connected to a first end of the first interconnect portion, and a width of the second interconnect portion is less than a width of the first interconnect portion. The conductive-line array includes a plurality of first conductive lines, and it is arranged over or below the first interconnect portion and provides an electrical connection between the interconnect structure and an electrical structure. A distance between at least one first conductive line and the first end is less than a distance between the first conductive line and a second end of the first interconnect portion which is opposite to the first end. Each of the first conductive lines has a via width, and a distance between any two of the first conductive lines is greater than or equal to the via width.

In accordance with some embodiments, an integrated circuit designing system is provided. The integrated circuit designing system includes a non-transitory storage medium. The non-transitory storage medium is configured to store a layout design of a semiconductor device. The layout design includes an interconnect structure layout pattern and a first conductive line layout pattern. The interconnect structure layout pattern is associated with forming an interconnect structure. The interconnect structure comprises a first interconnect portion and a second interconnect portion, the second interconnect portion is connected to a first end the first interconnect portion, and a width of the second interconnect portion is less than a width of the first interconnect portion. The first conductive line layout pattern is associated with forming a first conductive line which is arranged over or below the first interconnect portion for providing an electrical connection between the interconnect structure and an electrical structure. The distance between the first conductive line and the first end is less than a distance between the first conductive line and a second end of the first interconnect portion which is opposite to the first end.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
an interconnect structure, made of conductive material, and comprising a first interconnect portion and a second interconnect portion, wherein the second interconnect portion is connected to a first end of the first interconnect portion, and a width of the second interconnect portion is less than a width of the first interconnect portion; and
a first conductive line, arranged over or below the first interconnect portion and providing an electrical connection between the interconnect structure and an electrical structure, wherein a distance between the first conductive line and the first end is less than a distance between the first conductive line and a second end of the first interconnect portion which is opposite to the first end, and the first conductive line is arranged within the first interconnect portion and formed between the first end and the second end.

2. The semiconductor device as claimed in claim 1, wherein a length of the second interconnect portion is less than half of the width of the first interconnect portion.

3. The semiconductor device as claimed in claim 1, wherein the second interconnect portion is arranged in a straight-line shape, a T-shape or a L-shape.

4. The semiconductor device as claimed in claim 1, wherein the width of the first interconnect portion is greater than six times a minimum design width of the first interconnect portion.

5. The semiconductor device as claimed in claim 1, further comprising a second conductive line, arranged over or below the second interconnect portion, wherein the second conductive line is different from the first conductive line.

6. The semiconductor device as claimed in claim 5, wherein a via width of the first conductive line is equal to the minimum design width of the first interconnect portion, and a via width of the second conductive line is equal to minimum design width of the first interconnect portion.

7. The semiconductor device as claimed in claim 1, wherein the width of the second interconnect portion is greater than or equal to one minimum design width of the first interconnect portion.

8. A semiconductor device, comprising:
an interconnect structure, made of conductive material, and comprising a first interconnect portion and a second interconnect portion, wherein the second interconnect portion is connected to a first end of the first interconnect portion, and a width of the second interconnect portion is less than a width of the first interconnect portion; and
a conductive-line array, comprising a plurality of first conductive lines, arranged over or below the first interconnect portion and providing an electrical connection between the interconnect structure and an electrical structure, wherein a distance between at least one first conductive line and the first end is less than a distance between the first conductive line and a second end of the first interconnect portion which is opposite to the first end, each of the first conductive lines has a via width, and a distance between any two of the first conductive lines is greater than or equal to the via width, and the first conductive lines are arranged in a quadrilateral form and arranged between the first end and the second end.

9. The semiconductor device as claimed in claim 8, wherein the via width of the first conductive line is equal to the minimum design width of the first interconnect portion.

10. The semiconductor device as claimed in claim 9, wherein the distance between any two of the first conductive lines is less than ten times the via width.

11. The semiconductor device as claimed in claim 9, wherein distance between any two of the first conductive lines is less than one-third of the width of the first interconnect portion.

12. The semiconductor device as claimed in claim 8, wherein at least two of the first conductive lines are directly adjacent to each other.

13. The semiconductor device as claimed in claim 8, wherein the width of the first interconnect portion is greater than six times the minimum design width of the first interconnect portion, and length of the second interconnect portion is less than half of the width of the first interconnect portion.

14. The semiconductor device as claimed in claim 8, wherein the width of the second interconnect portion is greater than or equal to one minimum design width of the first interconnect portion.

15. The semiconductor device as claimed in claim 8, further comprising a second conductive line, arranged over or below the second interconnect portion, wherein the second conductive line is different from the first conductive line.

16. The semiconductor device as claimed in claim 15, wherein via width of the second conductive line is equal to the minimum design width of the first interconnect portion.

17. An integrated circuit designing system, comprising:
a non-transitory storage medium, the non-transitory storage medium configured to store a layout design of a semiconductor device, the layout design comprising:
an interconnect structure layout pattern associated with forming an interconnect structure, wherein the interconnect structure comprises a first interconnect portion and a second interconnect portion, the second interconnect portion is connected to a first end the first interconnect portion, and a width of the second interconnect portion is less than a width of the first interconnect portion; and
a first conductive line layout pattern associated with forming a first conductive line which is arranged over or below the first interconnect portion for providing an electrical connection between the interconnect structure and an electrical structure, wherein a distance between the first conductive line and the first end is less than a distance between the first conductive line and a second end of the first interconnect portion which is opposite to the first end, and the first conductive line layout pattern is arranged within the first interconnect portion and formed between the first end and the second end.

18. The integrated circuit designing system of claim 17, wherein a length of the second interconnect portion is less than half of the width of the first interconnect portion, and a via width of the first conductive line is equal to the minimum design width of the first interconnect portion.

19. The integrated circuit designing system as claimed in claim 17, wherein the width of the first interconnect portion is greater than six times a minimum design width of the first interconnect portion, and the width of the second interconnect portion is in a range from one minimum design width of the first interconnect portion to two times a minimum design width of the first interconnect portion.

20. The integrated circuit designing system as claimed in claim 17, further comprising a second conductive line, arranged over or below the second interconnect portion, wherein the second conductive line is different from the first conductive line, and via width of the second conductive line is equal to the minimum design width of the first interconnect portion.

* * * * *